United States Patent
Ko et al.

(10) Patent No.: US 10,224,253 B2
(45) Date of Patent: Mar. 5, 2019

(54) DISPLAY DEVICE

(71) Applicant: Samsung Display Co., Ltd., Yongin-si, Gyeonggi-do (KR)

(72) Inventors: Moo Soon Ko, Seoul (KR); Jeong-Soo Lee, Hwaseong-si (KR); Jung Hwa Kim, Gunpo-si (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 306 days.

(21) Appl. No.: 15/190,081

(22) Filed: Jun. 22, 2016

(65) Prior Publication Data

US 2016/0379907 A1    Dec. 29, 2016

(30) Foreign Application Priority Data

Jun. 25, 2015  (KR) .................. 10-2015-0090645

(51) Int. Cl.
*H01L 21/66* (2006.01)
*H01L 27/12* (2006.01)
*H01L 27/32* (2006.01)
*H01L 29/786* (2006.01)

(52) U.S. Cl.
CPC .......... *H01L 22/34* (2013.01); *H01L 27/1237* (2013.01); *H01L 27/1248* (2013.01); *H01L 29/786* (2013.01); *H01L 27/3244* (2013.01); *H01L 2227/323* (2013.01)

(58) Field of Classification Search
CPC combination set(s) only.
See application file for complete search history.

(56) References Cited

U.S. PATENT DOCUMENTS

| 9,245,468 | B2* | 1/2016 | Lee ................. G09G 3/006 |
| 2014/0062520 | A1* | 3/2014 | Kim ................. H01L 51/0031 324/762.01 |
| 2015/0162251 | A1* | 6/2015 | Jeong ................. H01L 27/124 257/48 |

FOREIGN PATENT DOCUMENTS

| KR | 10-1994-0011997 A | 6/1994 |
| KR | 10-2000-0056067 | 9/2000 |
| KR | 10-2008-0048627 A | 6/2008 |
| KR | 10-2008-0055248 A | 6/2008 |
| KR | 10-2014-0030682 A | 3/2014 |

* cited by examiner

*Primary Examiner* — Yu Chen
*Assistant Examiner* — Vincent Wall
(74) *Attorney, Agent, or Firm* — F. Chau & Associates, LLC

(57) ABSTRACT

A display device is disclosed. In one aspect, the display device includes a display area configured to display an image, a peripheral area neighboring the display area, and at least one test element group (TEG) including a test thin film transistor (TFT) formed in the peripheral area and a plurality of test pads electrically connected to the test TFT. The display device also includes first to third dummy circuits separated from the test TFT, each of the first to third dummy circuits including a plurality of first dummy semiconductor layers and a plurality of first dummy gate electrodes overlapping at least a portion of the first dummy semiconductor layers in the depth dimension of the display device.

12 Claims, 10 Drawing Sheets

DISPLAY DEVICE

CROSS-REFERENCE TO RELATED APPLICATION

This application claims priority to and the benefit of Korean Patent Application No. 10-2015-0090645 filed in the Korean Intellectual Property Office on Jun. 25, 2015, the entire contents of which are incorporated herein by reference.

BACKGROUND

Field

The described technology generally relates to a display device.

Description of the Related Technology

In manufacturing a display device, in order to confirm whether each process step has the desired results, the thickness of the substrate after each process step, resistance, concentration, degree of contamination, threshold value, and electric characteristic of an element must all be measured. In this measuring process, since the device can be damaged in the measuring process, it can be difficult to perform it on the actual substrate.

In this case, a pattern referred to as a test element group (TEG) is formed in a certain part of the substrate with the elements or in a separate blank region, and after the process that is performed for the actual substrate, the TEG is measured to evaluate the corresponding process.

The semiconductor layer formed in the TEG must be formed of the same shape and structure as the semiconductor layer of the display unit, thereby accurately measuring the electric characteristic of the thin film transistor of the display unit by using the TEG.

However, since the number of semiconductor layers in the TEG is typically much smaller than the number of semiconductor layers in the display unit, it is difficult to obtain a semiconductor layer in the TEG with the same shape and structure as the semiconductor layer of the display unit.

The above information disclosed in this Background section is only to enhance the understanding of the background of the described technology and therefore it can contain information that does not constitute the prior art that is already known in this country to a person of ordinary skill in the art.

SUMMARY OF CERTAIN INVENTIVE ASPECTS

One inventive aspect relates to a display device including a semiconductor layer of the TEG with the same shape as the semiconductor layer of the display unit.

Another aspect is a display device including a display area displaying an image and a peripheral area neighboring the display area according to an exemplary embodiment includes at least at least one TEG, which includes a test thin film transistor positioned in the peripheral area and a plurality of test pads connected to the test thin film transistor; and first to third dummy units formed to be separated from the test thin film transistor, wherein the first to third dummy units respectively include a plurality of first dummy semiconductor layers and a plurality of first dummy gate electrodes overlapping at least a portion of the plurality of first dummy semiconductor layers.

At least one of the first to third dummy units can overlap at least a portion of the test pad.

The test thin film transistor can include a test semiconductor layer; a test gate electrode overlapping the test semiconductor layer; and a test source electrode and a drain electrode respectively connected to a source region and a drain region of the test semiconductor layer.

The plurality of test pads can include a first test pad connected to the test source electrode; a second test pad connected to the test drain electrode; and a third test pad connected to the test gate electrode.

The display device can further include a first connection part connecting the test source electrode and the first test pad and a second connection part connecting the test drain electrode and the second test pad.

The first to third dummy units can respectively overlap the first to third test pads.

The first dummy unit can overlap the second connection part.

A first insulating layer formed between the first dummy semiconductor layer and the first dummy gate electrode, and a second insulating layer formed between the first dummy gate electrode and the first to third test pad can be further included, and the first insulating layer can have a first contact hole exposing the first dummy semiconductor layer, and the second insulating layer can have a second contact hole exposing the first dummy gate electrode.

The first connection part and the test source electrode can be integrally formed, and the second connection part and the test drain electrode can be integrally formed.

The first connection part and the first test pad can be integrally formed, and the second connection part and the second test pad can be integrally formed.

A separation distance of the first to third dummy units and the test semiconductor layer can be in a range of 50 μm-100 μm.

A fourth dummy unit formed between the TEGs to be separated can be further included.

The fourth dummy unit can include a plurality of second dummy semiconductor layers and a plurality of second dummy gate electrodes overlapping at least a portion of the plurality of second dummy semiconductor layers.

Another aspect is a display device comprising: a display area configured to display an image; a peripheral area neighboring the display area; at least one test element group (TEG) including a test thin film transistor (TFT) formed in the peripheral area and a plurality of test pads electrically connected to the test TFT; and first to third dummy circuits separated from the test TFT, wherein each of the first to third dummy circuits includes a plurality of first dummy semiconductor layers and a plurality of first dummy gate electrodes overlapping at least a portion of the first dummy semiconductor layers in the depth dimension of the display device.

In the above display device, at least one of the first to third dummy circuits overlaps at least a portion of at least one of the test pads in the depth dimension of the display device.

In the above display device, the test TFT includes: a test semiconductor layer including a source region and a drain region; a test gate electrode overlapping the test semiconductor layer in the depth dimension of the display device; and a test source electrode and a drain electrode respectively connected to the source and drain regions of the test semiconductor layer.

In the above display device, the test pads include: a first test pad electrically connected to the test source electrode; a second test pad electrically connected to the test drain electrode; and a third test pad electrically connected to the test gate electrode.

The above display device further comprises: a first connector configured to electrically connect the test source electrode to the first test pad; and a second connector configured to electrically connect the test drain electrode to the second test pad.

In the above display device, the first to third dummy circuits respectively overlap the first to third test pads in the depth dimension of the display device.

In the above display device, the first dummy circuit overlaps the second connector in the depth dimension of the display device.

The above display device further comprises: a first insulating layer interposed between the first dummy semiconductor layer and the first dummy gate electrode; and a second insulating layer interposed between the first dummy gate electrode and the first to third test pads, wherein the first insulating layer has a first contact hole formed over the first dummy semiconductor layer, and wherein the second insulating layer has a second contact hole formed over the first dummy gate electrode.

In the above display device, the first connector and the test source electrode are integrally formed, wherein the second connector and the test drain electrode are integrally formed.

In the above display device, the first connector and the first test pad are integrally formed, wherein the second connector and the second test pad are integrally formed.

In the above display device, the distance between at least one of the first to third dummy circuits and the test semiconductor layer is in the range of about 50 μm to about 100 μm.

In the above display device, the at least one TEG includes a plurality of TEGs, and wherein the display device further comprises a fourth dummy circuit formed between neighboring TEGs.

In the above display device, the fourth dummy circuit includes a plurality of second dummy semiconductor layers and a plurality of second dummy gate electrodes overlapping at least a portion of one of the second dummy semiconductor layers in the depth dimension of the display device.

Another aspect is a display device comprising: a substrate including a display area and a non-display area formed adjacent to the display area; a pixel formed in the display area and including a display thin film transistor (TFT), wherein the display TFT includes a display semiconductor layer; and a first dummy circuit formed in the non-display area, wherein the first dummy circuit includes a first dummy semiconductor layer and a first dummy gate electrode overlapping at least a portion of the first dummy semiconductor layer in the depth dimension of the display device, and wherein the display semiconductor layer and the first dummy semiconductor layer have substantially the same shape.

The above display device further comprises at least one test element group (TEG) formed in the non-display area and including a test TFT and at least one test pad electrically connected to the test TFT, wherein the test TFT includes the first dummy semiconductor layer.

In the above display device, the first dummy semiconductor layer is separated from the test pad.

In the above display device, the test TFT further comprises a test gate electrode configured to electrically connect the first dummy semiconductor layer to the test pad.

The above display device further comprises a second dummy circuit formed adjacent to the first dummy circuit and a third dummy circuit formed adjacent to the second dummy circuit, wherein the test TFT further includes a test source electrode and a test drain electrode, and wherein the test source and drain electrodes are respectively connected to the second and third dummy circuits.

The above display device further comprises a connector configured to electrically connect the drain electrode of the test TFT to the third dummy circuit, wherein the connector does not overlap the second dummy circuit in the depth dimension of the display device.

In the above display device, the test TFT further comprises: a gate insulating layer formed over the first dummy semiconductor layer; and an interlayer insulating layer formed over the gate insulating layer and the first dummy gate electrode, wherein the gate and interlayer insulating layers have a first contact hole through which the test pad and the first semiconductor layer are connected, and wherein the interlayer insulating layer has a second contact hole through which the test pad and the first dummy gate electrode are connected.

According to at least one of the disclosed embodiments, a semiconductor layer of the TEG with the same shape as the semiconductor layer of the display unit can be obtained.

Also, the semiconductor layer of the TEG is formed of the same structure as the thin film transistor of the display unit, thereby measuring the electric characteristic of the thin film transistor of the display unit by using the semiconductor layer of the TEG.

DETAILED DESCRIPTION OF CERTAIN INVENTIVE EMBODIMENTS

Figure 1:
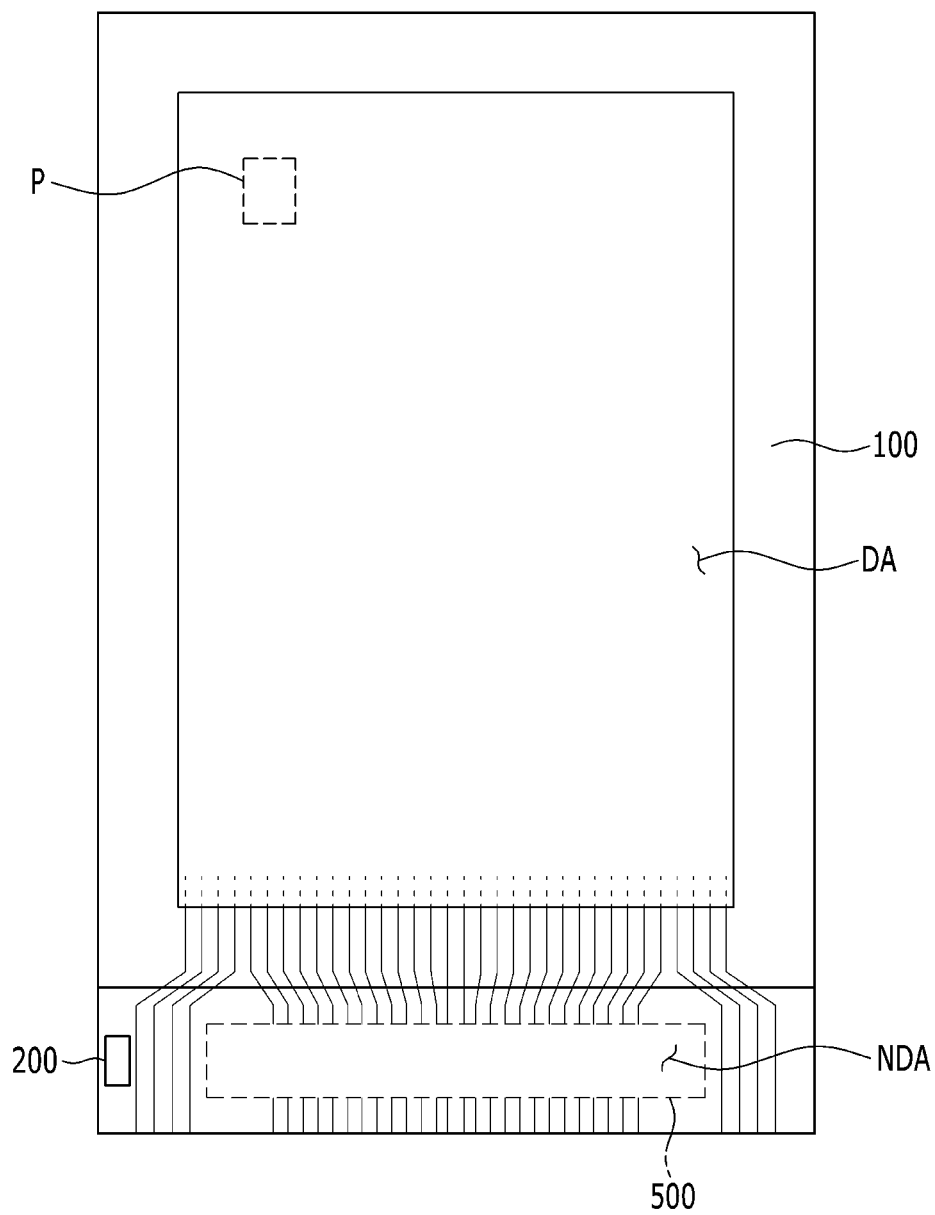
FIG. 1 is a top plan view of a display device according to an exemplary embodiment.

Hereinafter, the described technology will be described more fully with reference to the accompanying drawings, in which exemplary embodiments are shown. As those skilled in the art would realize, the described embodiments can be modified in various different ways, all without departing from the spirit or scope. The drawings and description are to be regarded as illustrative in nature and not restrictive. Like reference numerals designate like elements throughout the specification.

Further, in the drawings, the size and thickness of each element are randomly represented for better understanding and ease of description, and the described technology is not limited thereto.

In the drawings, the thickness of layers, films, panels, regions, etc., are exaggerated for clarity. In the drawings, for better understanding and ease of description, the thicknesses of some layers and areas are exaggerated. It will be understood that when an element such as a layer, film, region, or substrate is referred to as being "on" another element, it can be directly on the other element or intervening elements can also be present.

In addition, unless explicitly described to the contrary, the word "comprise" and variations such as "comprises" or "comprising", will be understood to imply the inclusion of stated elements but not the exclusion of any other elements. In addition, "on" is either positioned on or below a portion of a target or positioned on the upper side based on a gravitational direction throughout the specification. In this disclosure, the term "substantially" includes the meanings of completely, almost completely or to any significant degree under some applications and in accordance with those skilled in the art. The term "connected" can include an electrical connection.

Now, a display device according to an exemplary embodiment will be described with reference to FIG. 1 to FIG. 4.

Figure 2:
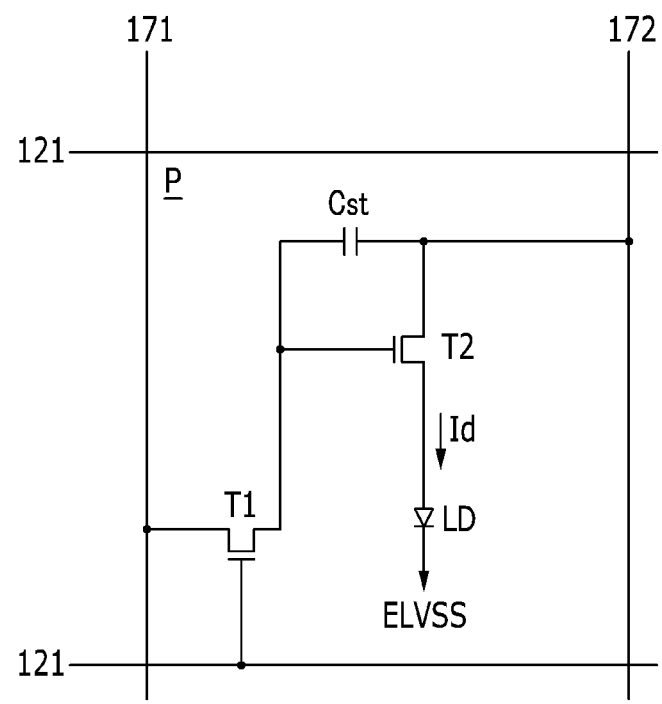
FIG. 2 is a circuit diagram showing a pixel of the display unit shown in FIG. 1.
Figure 3:
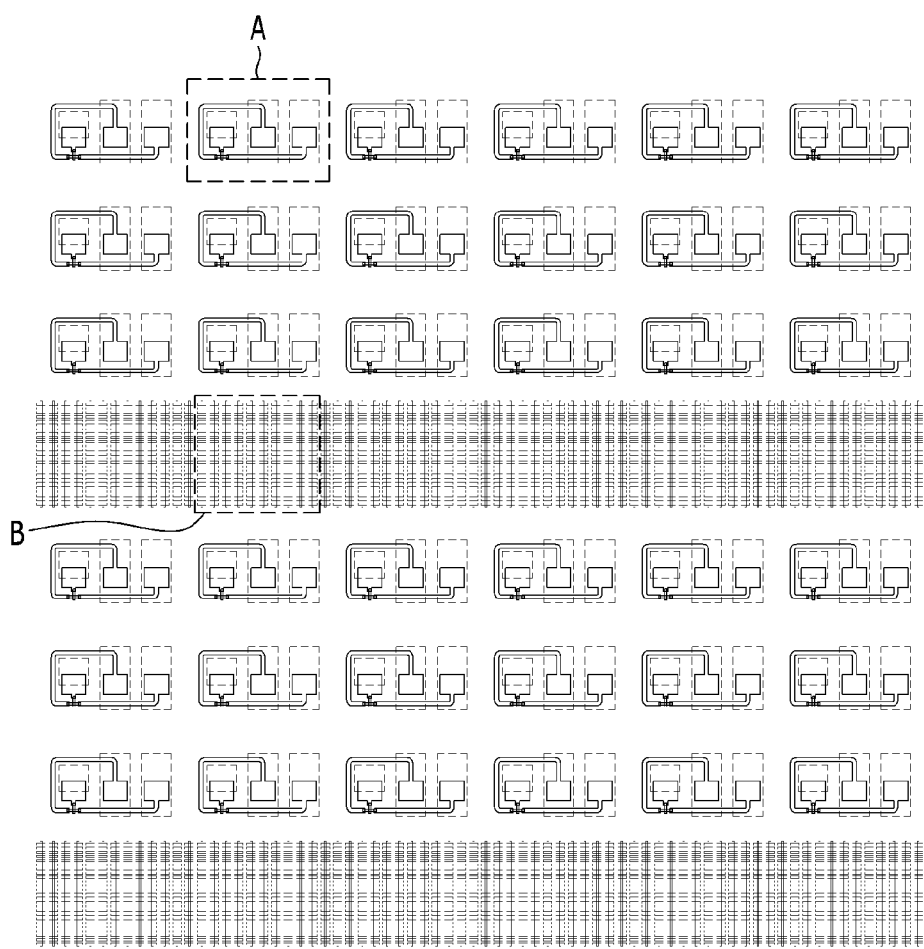
FIG. 3 is an enlarged view of a region in which the TEG is formed in FIG. 1.
Figure 4:
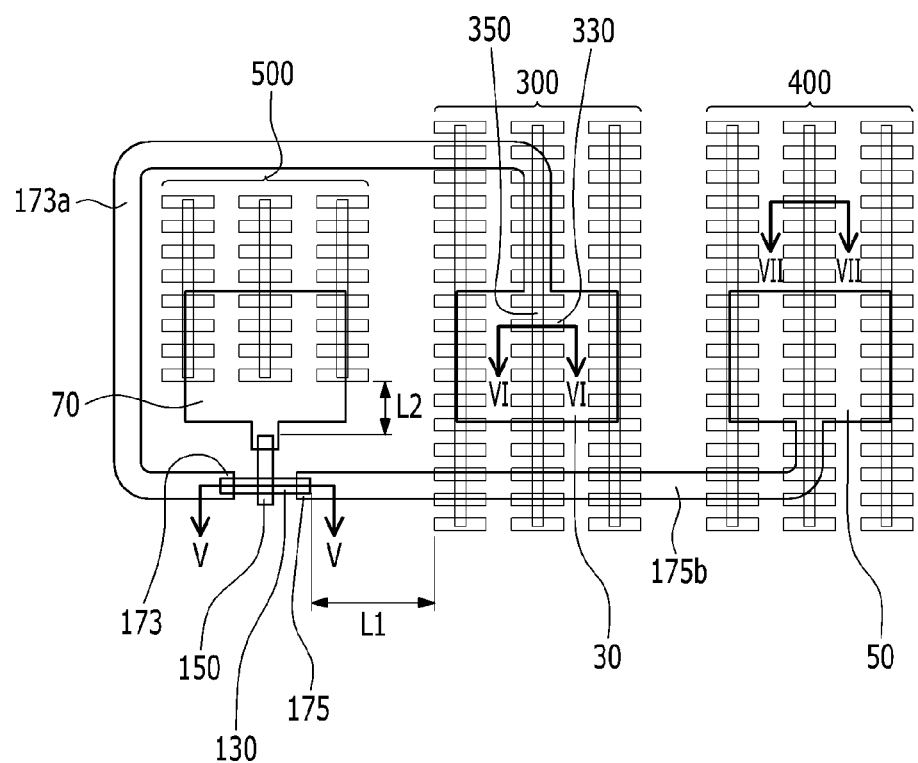
FIG. 4 is an enlarged view of region A of FIG. 3.

FIG. 1 is a top plan view of a display device according to an exemplary embodiment. FIG. 2 is a circuit diagram showing a pixel of the display unit shown in FIG. 1. FIG. 3 is an enlarged view of a region in which a TEG is formed in FIG. 1. FIG. 4 is an enlarged view of region A of FIG. 3.

Referring to FIG. 1, a display device 1000 according to an exemplary embodiment includes a substrate 100, a display unit DA, and a peripheral area NDA.

The substrate 100 can be formed of an inorganic material such as glass, a metal material, or an organic material such as a resin. The substrate 100 can transmit light or block light, and can be flexible.

The display unit DA is formed on the substrate 100 and displays an image through a plurality of pixels P. Here, the pixel P refers to a minimum unit for displaying an image and it can be an organic light-emitting element such as an organic light-emitting diode (OLED). However, the pixel P applied to the display device according to the present exemplary embodiment is not limited thereto, and the pixel P can be a liquid crystal display element and an electrophoretic display element.

As shown in FIG. 2, the pixel P includes two or more thin film transistors T1 and T2, at least one capacitor Cst, and an organic light emitting element LD. The thin film transistor basically includes a first thin film transistor T1 and a second thin film transistor T2.

The first thin film transistor T1 is connected to a scan line 121 and a data line 171 and transmits a data voltage input from the data line 171 to the second thin film transistor T2 depending on a switching voltage input to the scan line 121. The capacitor Cst is connected to the first thin film transistor T1 and a driving power source line 172 and stores a voltage corresponding to the difference between the voltage transmitted from the first thin film transistor T1 and the voltage supplied to the driving power source line 172.

The second thin film transistor T2 is connected to the driving power source line 172 and the capacitor Cst and supplies an output current $I_d$ that is substantially proportional to the square of the difference between a voltage stored in the capacitor Cst and a threshold voltage to the organic light emitting element LD. The organic light emitting element LD is emitted by the output current $I_d$ and the current supplied from a common power source line ELVSS.

Meanwhile, the peripheral area NDA is a region formed near the display unit DA and is formed with a driving circuit unit (or driving circuit) DCU driving the display unit DA. In the present exemplary embodiment, the peripheral area NDA is positioned in a lower end of the display unit DA, however it is not limited thereto and it can be formed in an upper side, a right side, or a left side of the peripheral area NDA.

In this case, the driving circuit unit DCU is connected to the display unit DA, and a flexible printed circuit board (FPCB) can be connected to a driving circuit unit DCU. A driving signal to drive the display unit DA can be supplied to the driving circuit unit DCU from the outside through the flexible printed circuit board (FPCB). The driving signal is supplied to the display unit DA through the driving circuit unit DCU. Here, the driving signal means a signal supplied to the driving power source line 172, the common power source line ELVSS, the scan line 121, the data line 171, and the like.

According to an exemplary embodiment, the peripheral area NDA includes a region A (shown in FIG. 3) with at least one TEG and first to third dummy units (or first to third dummy circuits) 300, 400, and 500 (shown in FIG. 4). A fourth dummy unit 700 (or fourth dummy circuit) shown in FIG. 8 may be formed between the TEGs, for example in region B of FIG. 3. In this case the TEG and the first to fourth dummy units 300, 400, 500, and 700 can be formed in test unit (or test circuit) 200 near the driving circuit unit DCU. According to the present exemplary embodiment, as shown in FIG. 3, a plurality of TEGs are formed in the test unit 200.

Referring to FIG. 4, each TEG includes a test thin film transistor Test_TR and a plurality of test pad Test_PAD connected to the test thin film transistor Test_TR.

The test thin film transistor Test_TR includes a test semiconductor layer 130, a test gate electrode 150 overlapping a portion of the test semiconductor layer 130 and transmitting a gate signal, and a test source electrode 173 and a test drain electrode 175 respectively connected to a source region 133 and a drain region 135 of the test semiconductor layer 130. The test thin film transistor Test_TR is formed by the same process as the thin film transistors T1 and T2 of the display unit DA.

Also, the test pads Test_PAD includes a first test pad 30 connected to the test source electrode 173, a second test pad 50 connected to the test drain electrode 175, and a third test pad 70 connected to the test gate electrode 150.

The first to third test pads 30, 50, and 70 can be widely formed to contact a probe inputting an external signal. The gate signal is input to the third test pad 70 and the data signal flowing to each of the first and second test pads 30 and 50 by using the probe to confirm the electric characteristic of the test thin film transistor Test_TR, thereby confirming the electric characteristic of the thin film transistors T1 and T2 included in the display unit DA.

In this case, the first test pad 30 can be connected to the test source electrode 173 through the first connection part 173a and the second test pad 50 can be connected to the test drain electrode 175 through the second connection part 175b.

On the other hand, the first test pad 30, the second test pad 50, and the third test pad 70 are positioned in the same layer and formed of the same material as the test source electrode 173, the test drain electrode 175, and the test gate electrode 150, respectively, though they can be formed in a different layer with a different material. When the first test pad 30, the second test pad 50, and the third test pad 70 are formed in the same layer and of the same material as the test source electrode 173, the test drain electrode 175, and the test gate electrode 150, the first and second connection parts 173a and 175b can also be formed of the same material and in the same layer as the first test pad 30, the second test pad 50, and the third test pad 70, respectively.

Hereafter, a layered structure of the test thin film transistor Test_TR will be described in detail with reference to FIG. 5.

Figure 5:
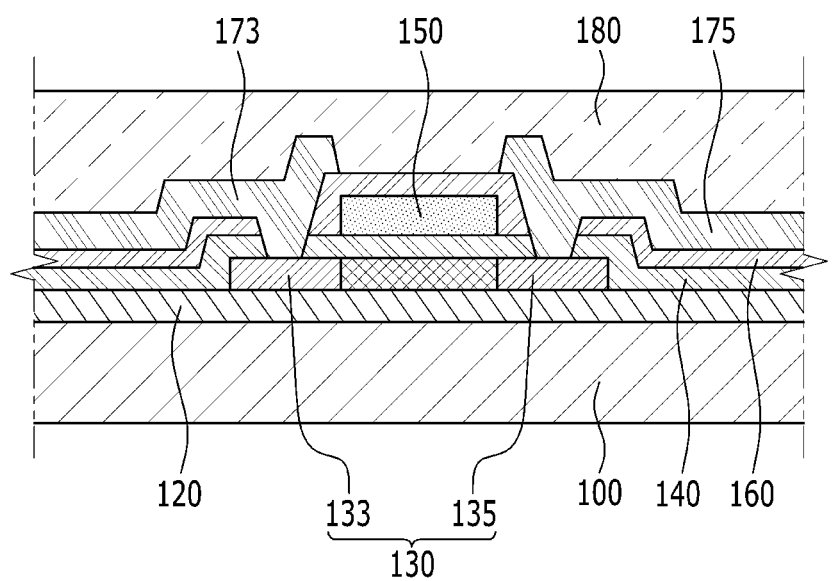
FIG. 5 is a cross-sectional view of the display device of FIG. 4 taken along line V-V.

FIG. 5 is a cross-sectional view of the display device of FIG. 4 taken along line V-V.

Referring to FIG. 5, a buffer layer 120 is formed on the substrate 100 of the peripheral area NDA. Also, a test semiconductor layer 130 is formed on the buffer layer 120, and a gate insulating layer 140 is formed on the test semiconductor layer 130 and the buffer layer 120. The test gate electrode 150 is formed on the gate insulating layer 140, and an interlayer insulating layer 160 is formed on the test gate electrode 150 and the gate insulating layer 140.

A test source electrode 173 and a test drain electrode 175 are formed on the interlayer insulating layer 160, and the source region 133 and the drain region 135 of the test semiconductor layer 130 are respectively connected to the test source electrode 173 and the test drain electrode 175 through an opening formed in the interlayer insulating layer 160 and the gate insulating layer 140. A passivation layer 180 is formed on the test source electrode 173 and the test drain electrode 175.

On the other hand, according to an exemplary embodiment, first to third dummy units 300, 400, and 500 are formed to be separated from the test thin film transistor Test_TR.

The first to third dummy units 300, 400, and 500 respectively include a plurality of first dummy semiconductor layers 330 and a plurality of first dummy gate electrodes 350 overlapping at least portion of the first dummy semiconductor layers 330.

As shown in FIG. 4, the first dummy unit 300 is formed to overlap the first test pad 30. That is, the first dummy semiconductor layers 330 and the first dummy gate electrodes 350 of the first dummy unit 300 can be formed to overlap the first test pad 30. The first dummy semiconductor layers 330 and the first dummy gate electrodes 350 can also overlap the first connection part 173a and the second connection part 175b. In this case, one first dummy gate electrode 350 can be formed to overlap the first dummy semiconductor layers 330 arranged in one row.

Also, the second dummy unit 400 can be formed to overlap the second test pad 50 and the third dummy unit 500 can be formed to overlap the third test pad 70. In this case, the third dummy unit 500 can be formed to not overlap the first connection part 135a.

Hereafter, the layered structure of the first and second dummy units 300 and 400 will be described with reference to FIG. 6 and FIG. 7.

Figure 6:
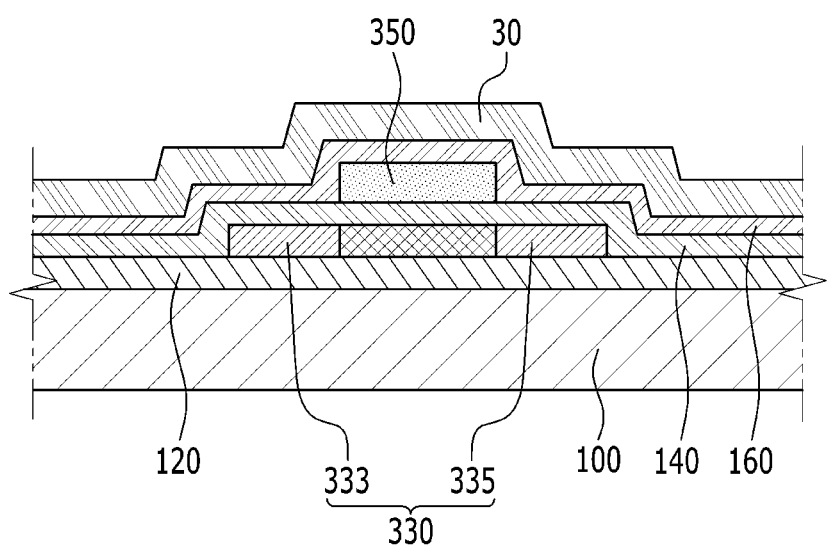
FIG. 6 is a cross-sectional view of the display device of FIG. 4 taken along line VI-VI.

FIG. 6 is a cross-sectional view of the display device of FIG. 4 taken along line VI-VI. FIG. 7 is a cross-sectional view of the display device of FIG. 4 taken along line VII-VII.

Referring to FIG. 6, the buffer layer 120 is formed on the substrate 100. Also, the first dummy semiconductor layer 330 including the source region 333 and the drain region 335 is formed on the buffer layer 120, and the gate insulating layer 140 is formed on the first dummy semiconductor layer 330 and buffer layer 120. The first dummy gate electrode 350 is formed on the gate insulating layer 140, and the interlayer insulating layer 160 is formed on the first dummy gate electrode 350 and the gate insulating layer 140. Also, the first test pad 30 can be formed on the interlayer insulating layer 160.

Figure 7:
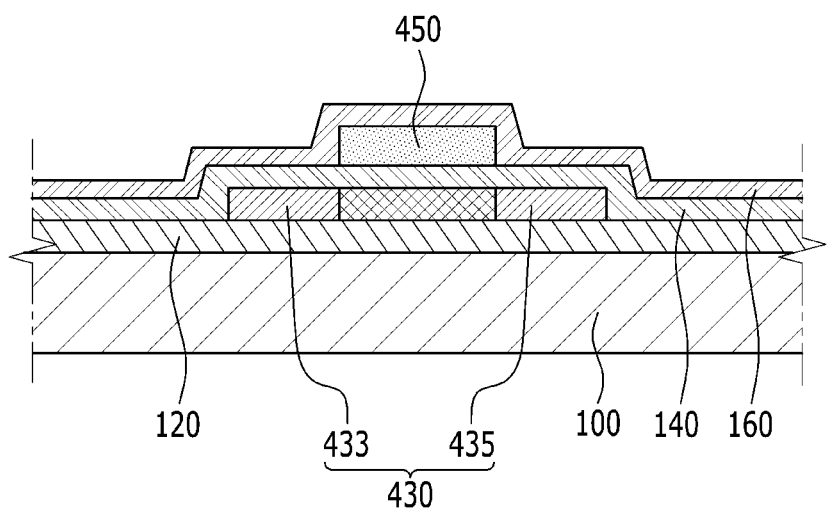
FIG. 7 is a cross-sectional view of the display device of FIG. 4 taken along line VII-VII.

Referring to FIG. 7, the buffer layer 120 is formed on the substrate 100. Also, the first dummy semiconductor layer 430 including the source region 433 and the drain region 435 is formed on the buffer layer 120, and the gate insulating layer 140 is formed on the first dummy semiconductor layer 430 and the buffer layer 120. The first dummy gate electrode 450 is formed on the gate insulating layer 140, and the interlayer insulating layer 160 is formed on the first dummy gate electrode 450 and the gate insulating layer 140.

In the present exemplary embodiment, the first dummy semiconductor layer 330 and the first dummy gate electrode 350 are formed by the same process and with the same structure as the test semiconductor layer 130 and the test gate electrode 150, respectively, of the test thin film transistor Test_TR. That is, the first dummy semiconductor layers 330 and 430 and the test semiconductor layer 130 can be substantially simultaneously formed with the same structure.

In this case, the first to third dummy units 300, 400, and 500 are formed to be separated from the test semiconductor layer 130 of the test thin film transistor Test_TR by a predetermined distance.

The test semiconductor layer 130 formed in the peripheral area NDA includes the semiconductor layer with less thin film transistors T1 and T2 than are formed in the display unit DA. In this case, in the process of substantially simultaneously patterning the semiconductor layer of the thin film transistors T1 and T2 and the test semiconductor layer 130, the number of test semiconductor layers 130 is less than that of the semiconductor layer of the thin film transistors T1 and T2, such that it is difficult to obtain the same shape for the semiconductor layer. As described above, if the first to third dummy units 300, 400, and 500 are not formed, the structure and the shape of the test semiconductor layer 130 are different from the semiconductor layer of the thin film transistors T1 and T2 such that it is difficult to measure the electric characteristic of the thin film transistor T1 and T2 by using the test semiconductor layer 130.

According to the present exemplary embodiment, if the first to third dummy units 300, 400, and 500 are formed to be close to the test semiconductor layer 130, the test semiconductor layer 130 can be easily formed with the same structure as the semiconductor layer of the thin film transistors T1 and T2. If the first to third dummy unit 300, 400, and 500 are formed to not be close to the test semiconductor layer 130, it is difficult to form the test semiconductor layer with the same structure as the semiconductor layer of the thin film transistors T1 and T2 by the etching process. Unlike the display unit, the number of test semiconductor layers in the TEG, i.e., the density of the semiconductor layer to be formed by the etching process, is low such that it is difficult to form the semiconductor layer with the desired structure or shape. However, if the first to third dummy units 300, 400, and 500 are formed to be close to the test semiconductor layer 130, the density of the semiconductor layer to be formed is increased such that the desired shape and structure of the semiconductor layer can be easily obtained.

Since the test semiconductor layer 130 is formed with the same structure as that of the thin film transistors T1 and T2 included in the display unit DA, the electric characteristic of the thin film transistors T1 and T2 can be measured by using the test semiconductor layer 130.

On the other hand, referring to FIG. 4, the first dummy unit 300 and the test semiconductor layer 130 is formed to be separated by a first separation distance L1. Also, the second dummy unit 400 and the test semiconductor layer 130 can be formed to be separated by a second separation distance L2. Here, the first and second separation distances L1 and L2 can be in the range of about 50 μm to about 100 μm.

Figure 8:
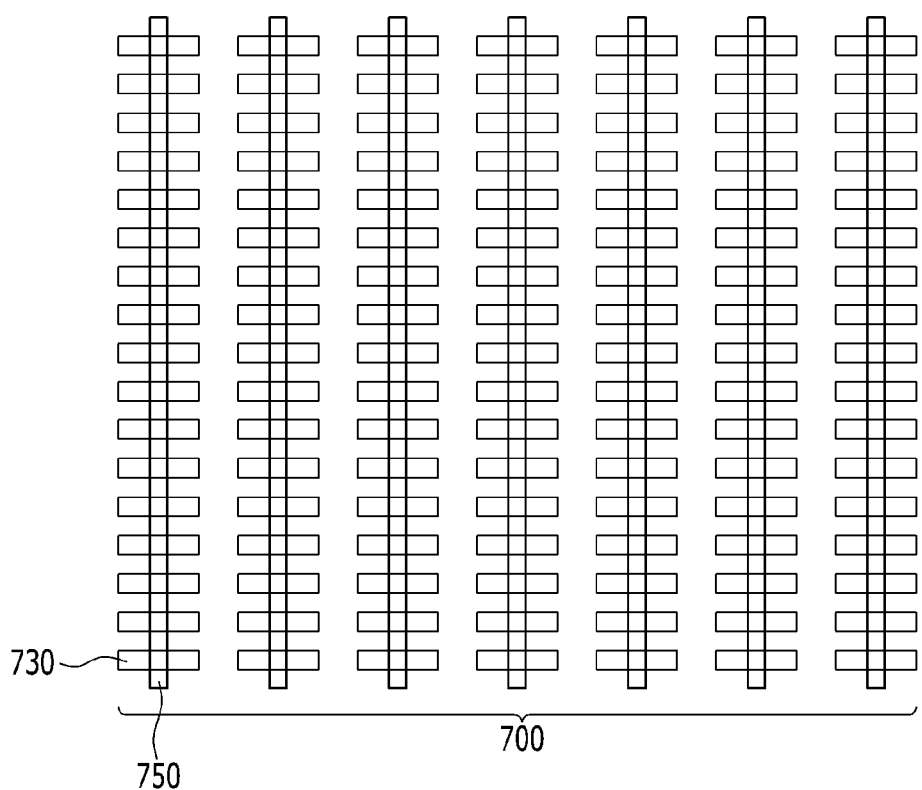
FIG. 8 is an enlarged view of region B of FIG. 3.

FIG. 8 is an enlarged view of region B of FIG. 3. Referring to FIG. 3 and FIG. 8, a fourth dummy unit 700 is formed between the TEGs. That is, in addition to the first to third dummy units 300, 400, and 500 formed in each TEG shown in FIG. 4, the fourth dummy unit 700 can be formed between a TEG and another TEG.

In this case, the fourth dummy unit 700 includes a plurality of second dummy semiconductor layers 730 and a plurality of second dummy gate electrodes 750 overlapping at least a portion of the second dummy semiconductor layers 730. One second dummy gate electrode 750 can be formed to overlap a plurality of second dummy semiconductor layers 730 arranged in one line.

Hereafter, the display device according to another exemplary embodiment will be described with reference to FIG. 9 and FIG. 10. When describing the display device according to another exemplary embodiment, the detailed description of the same configuration as the above display device will be omitted.

Figure 9:
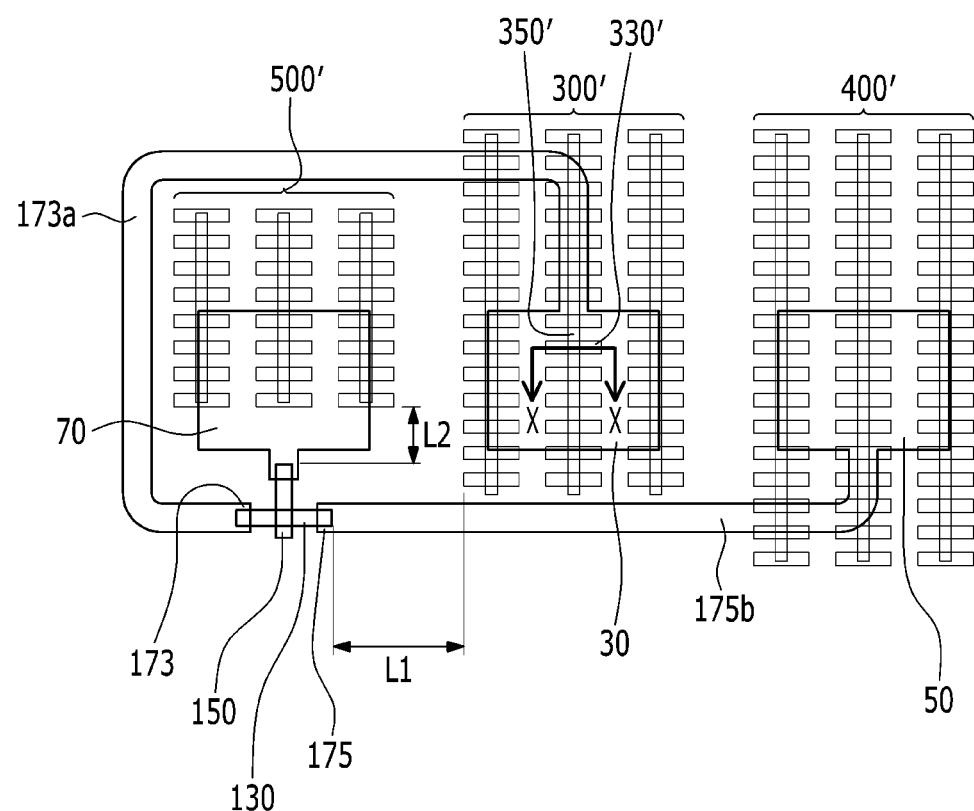
FIG. 9 is a top plan view of a TEG of a display device according to another exemplary embodiment.

FIG. 9 is a top plan view of a TEG of a display device according to another exemplary embodiment. FIG. 10 is a cross-sectional view of the display device of FIG. 9 taken along line X-X.

Referring to FIG. 9, first to third dummy units 300', 400', and 500' are formed to be separated from the test thin film transistor Test_TR.

The first to third dummy units 300', 400', and 500' respectively include a plurality of first dummy semiconductor layers 330' and a plurality of first dummy gate electrodes 350' overlapping at least portion of the first dummy semiconductor layer 330'.

As shown in FIG. 9, the first dummy unit 300' is formed to overlap the first test pad 30. That is, a plurality of first dummy semiconductor layers 330' and a plurality of first dummy gate electrodes 350' of the first dummy unit 300' can be formed to overlap the first test pad 30.

In this case, a plurality of first dummy semiconductor layers 330' and a plurality of first dummy gate electrodes 350' can be formed to overlap the first connection part 173a. Unlike the exemplary embodiment described referring to FIG. 4, in the exemplary embodiment of FIG. 9, a plurality of first dummy semiconductor layers 330' and a plurality of first dummy gate electrodes 350' do not overlap the second connection part 175b.

Also, the second dummy unit 400' can be formed to overlap the second test pad 50, and the third dummy unit 500' can be formed to overlap the third test pad 70. In this case, the third dummy unit 500' can be formed to not overlap the first connection part 135a.

Next, the layered structure of the first dummy unit 300' will described with reference to FIG. 10.

Figure 10:
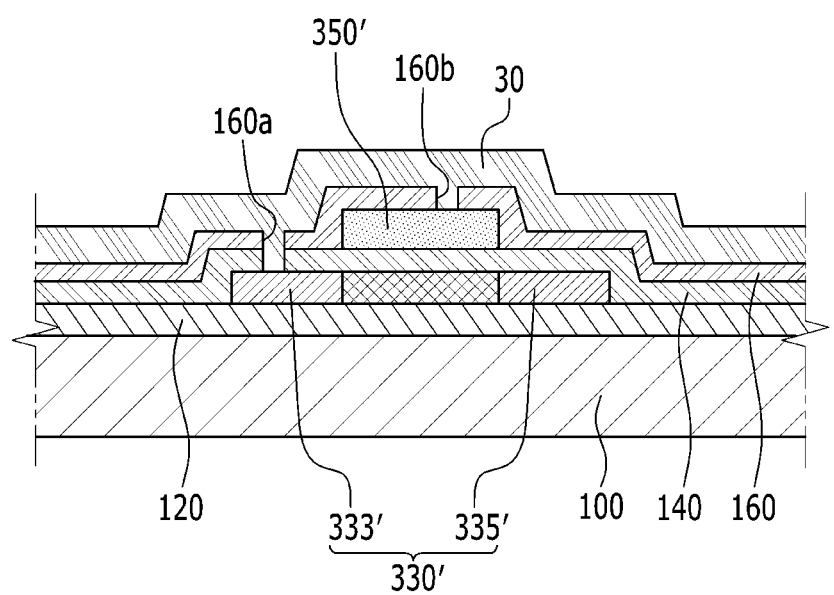
FIG. 10 is a cross-sectional view of the display device of FIG. 9 taken along line X-X.

Referring to FIG. 10, the buffer layer 120 is formed on the substrate 100. Also, the first dummy semiconductor layer 330' including the source region 333' and the drain region 335' is formed on the buffer layer 120, and the gate insulating layer 140 is formed on the first dummy semiconductor layer 330' and the buffer layer 120. The first dummy gate electrode 350' is formed on the gate insulating layer 140, and the interlayer insulating layer 160 is formed on the first dummy gate electrode 350' and the gate insulating layer 140.

Also, the first test pad 30 can be formed on the interlayer insulating layer 160. In this case, the first test pad 30 can be connected to the first dummy semiconductor layer 330' through the first contact hole 160a formed in the interlayer insulating layer 160 and the gate insulating layer 140. Also, the first test pad 30 can be connected to the first dummy gate electrode 350' through the second contact hole 160b formed in the interlayer insulating layer 160.

In the present exemplary embodiment, if the first and second contact holes 160a and 160b are formed, a structure to similar to the display unit can be obtained. A number of contact holes are formed inside the display unit and the contact holes influence the etching process. However, if a contact hole is not formed inside the TEG, the influencing factor of the etching process disappears such that a different etching process from inside of the display unit can be performed. That is, in the etching process substantially simultaneously forming the semiconductor layers of the display unit and the TEG, the semiconductor layers can be formed with different structures inside the display unit and the TEG. Accordingly, by disposing the first and second contact holes 160a and 160b inside the TEG, the same environment as the display unit is formed such that the semiconductor layer in the TEG with the same structure as the semiconductor layer of the display unit can be formed.

In the display device according to an exemplary embodiment, the first to third dummy units 300, 400, and 500 are formed to be separated from the test thin film transistor Test_TR of the TEG, and thus the test semiconductor layer 130 can be easily formed with the same structure as the semiconductor layer of the thin film transistors T1 and T2. The test semiconductor layer 130 is formed having the same structure as the thin film transistors T1 and T2 included in the display unit DA, thereby easily measuring the electric characteristic of the thin film transistors T1 and T2 by using the test semiconductor layer 130.

While the inventive technology has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A display device comprising:
   a display area configured to display an image;
   a peripheral area neighboring the display area;
   at least one test element group (TEG) including a test thin film transistor (TFT) formed in the peripheral area and a plurality of test pads electrically connected to the test TFT; and
   first to third dummy circuits separated from the test TFT, wherein each of the first to third dummy circuits includes a plurality of first dummy semiconductor layers and a plurality of first dummy gate electrodes overlapping at least a portion of the first dummy semiconductor layers in the depth dimension of the display device;
   wherein at least one of the first to third dummy circuits overlaps at least a portion of at least one of the test pads in the depth dimension of the display device.

2. The display device of claim 1, wherein the test TFT includes:
   a test semiconductor layer including a source region and a drain region;
   a test gate electrode overlapping the test semiconductor layer in the depth dimension of the display device; and
   a test source electrode and a drain electrode respectively connected to the source and drain regions of the test semiconductor layer.

3. The display device of claim 2, wherein the test pads include:

a first test pad electrically connected to the test source electrode;

a second test pad electrically connected to the test drain electrode; and a third test pad electrically connected to the test gate electrode.

4. The display device of claim 3, further comprising:

a first connector configured to electrically connect the test source electrode to the first test pad; and a second connector configured to electrically connect the test drain electrode to the second test pad.

5. The display device of claim 4, wherein the first to third dummy circuits respectively overlap the first to third test pads in the depth dimension of the display device.

6. The display device of claim 5, wherein the first dummy circuit overlaps the second connector in the depth dimension of the display device.

7. The display device of claim 5, further comprising:

a first insulating layer interposed between the first dummy semiconductor layer and the first dummy gate electrode; and a second insulating layer interposed between the first dummy gate electrode and the first to third test pads, wherein the first insulating layer has a first contact hole formed over the first dummy semiconductor layer, and wherein the second insulating layer has a second contact hole formed over the first dummy gate electrode.

8. The display device of claim 4, wherein the first connector and the test source electrode are integrally formed, and wherein the second connector and the test drain electrode are integrally formed.

9. The display device of claim 8, wherein the first connector and the first test pad are integrally formed, and wherein the second connector and the second test pad are integrally formed.

10. The display device of claim 2, wherein the distance between at least one of the first to third dummy circuits and the test semiconductor layer is in the range of about 50 μm to about 100 μm.

11. The display device of claim 1, wherein the at least one TEG includes a plurality of TEGs, and wherein the display device further comprises a fourth dummy circuit formed between neighboring TEGs.

12. The display device of claim 11, wherein the fourth dummy circuit includes a plurality of second dummy semiconductor layers and a plurality of second dummy gate electrodes overlapping at least a portion of one of the second dummy semiconductor layers in the depth dimension of the display device.

* * * * *